United States Patent [19]

Hobrecht

[11] 4,177,432

[45] Dec. 4, 1979

[54] MULTI OUTPUT DIFFERENTIAL AMPLIFIER

[75] Inventor: Stephen W. Hobrecht, Sunnyvale, Calif.

[73] Assignee: National Semiconductor Corporation, Santa Clara, Calif.

[21] Appl. No.: 919,160

[22] Filed: Jun. 26, 1978

[51] Int. Cl.$^2$ .......................... H03F 3/45; H03C 3/68
[52] U.S. Cl. ................................... 330/252; 307/244; 330/148; 330/260; 330/295
[58] Field of Search ............... 330/51, 69, 124 R, 148, 330/252, 295, 260; 307/244; 328/105, 106, 153

[56] References Cited

U.S. PATENT DOCUMENTS 3,528,020 9/1970 Rando .............................. 330/295 X Primary Examiner—James B. Mullins
Attorney, Agent, or Firm—Brown & Martin

[57] ABSTRACT

Disclosed is a differential amplifier having a pair of input terminals and multiple output terminals. Various ones of the output terminals are selectively enabled in response to output selection signals. Within the amplifier is a first transistorized circuit which generates analog signals representative of any voltage difference between the input terminals. A second transistorized circuit within the amplifier couples these analog signals to selected ones of the output terminals in response to the output selection signals.

9 Claims, 5 Drawing Figures

| EN | AO | AI | ACTIVE OUTPUT | $X_0$ | $X_1$ | $X_2$ | $X_3$ | $Y_0$ | $Y_1$ | $Y_2$ | $Y_3$ |
|---|---|---|---|---|---|---|---|---|---|---|---|
| H | ∅ | ∅ | NONE | ∅ | ∅ | ∅ | ∅ | ∅ | ∅ | ∅ | ∅ |
| L | L | L | $O_0$ | L | H | H | H | L | OC | OC | OC |
| L | H | L | $O_1$ | H | L | H | H | OC | L | OC | OC |
| L | L | H | $O_2$ | H | H | L | H | OC | OC | L | OC |
| L | H | H | $O_3$ | H | H | H | L | OC | OC | OC | L |

MULTI OUTPUT DIFFERENTIAL AMPLIFIER

BACKGROUND OF THE INVENTION

This invention relates to electronic amplifiers; and more particularly to electronic differential amplifiers integrated on a single semiconductor chip. In the prior art, a wide variety of specific circuits have been developed for differential amplifiers. Basically, these amplifiers all have a high open loop gain and a high input impedance. Typically, the gain of the amplifier, with no external feedback is on the order of several thousand; and the input impedance is on the order of several hundred thousand ohms.

These differential amplifiers have a wide variety of applications. For example, they are used in stereo systems to amplify the signal to the speaker. They are also used in tape recording systems to drive the write head. Additionally, they are used as operational amplifiers and as function generators. These and other applications are described, for example, in The Linear Applications Handbook #2 by National Semiconductor Corporation, 1977.

In the past however, all of the differential amplifiers had only a single output. Thus, one operational amplifier was typically used for each operation or function to be performed. In other words, each of the amplifiers had one feedback network; and this feedback network was tailored to perform a single function. Alternatively in the past, multiple functions were performed by a single operational amplifier which had multiple feedback networks that were mechanically switched across the amplifier in accordance with the particular function to be performed. Simultaneously, the output of the amplifier was mechanically switched to one of several other circuits that were to receive the amplifier's output depending upon the function it performed.

Various undesirable aspects are associated with both of these prior art circuits. For example, when one differential amplifier performs only one function, then any system which performs multiple functions requires a corresponding multiple of amplifiers. As a result, these multi-function systems are expensive and awkward to package. Alternatively, a multi-function system that uses only a single differential amplifier and mechanically switched feedback circuits is also unattractive. This is because these systems require multiple switches, which also are expensive and awkward to package.

Accordingly, it is one object of the invention to provide an improved differential amplifier.

Another object of the invention is to provide a differential amplifier on a single chip having more than one output.

Still another object of the invention is to provide an amplfier on a single chip having multiple outputs which are selectively activated in response to logic signals.

SUMMARY OF THE INVENTION

These and other objects are accomplished in accordance with the invention by a differential amplifier which is integrated on a semiconductor substrate. The amplifier includes a pair of input terminals and a first transistorized circuit for generating an analog signal representative of any voltage difference between signals applied to the pair of terminas. Also included are a plurality of transistorized output circuits. Each of the output circuits has an input coupled to receive the analog signal, and has an output connected to its own output terminal. Other circuits are included which selectively bias the transistors in the output circuits to either an active or inactive state in response to output selection signals. Preferably, there is also included a circuit for clamping the analog signal whenever the selection signals bias all of the output transistor circuits into an inactive state. This eliminates audible noise during switching when the amplifier is used to drive a speaker in an audio system. Also, preferably there is included on chip decode logic for receiving encoded logic signals which designate the output circuit to be activated. This reduces the number of pins on the chip.

BRIEF DESCRIPTION OF THE DRAWINGS

The novel features of the disclosed invention are set forth in the appended claims. The disclosed specific embodiments of the invention, however, will best be understood by reference to the drawings when read in conjunction with the following detailed description, wherein:

DETAILED DESCRIPTION OF SPECIFIC EMBODIMENTS

Figures 1, 2:
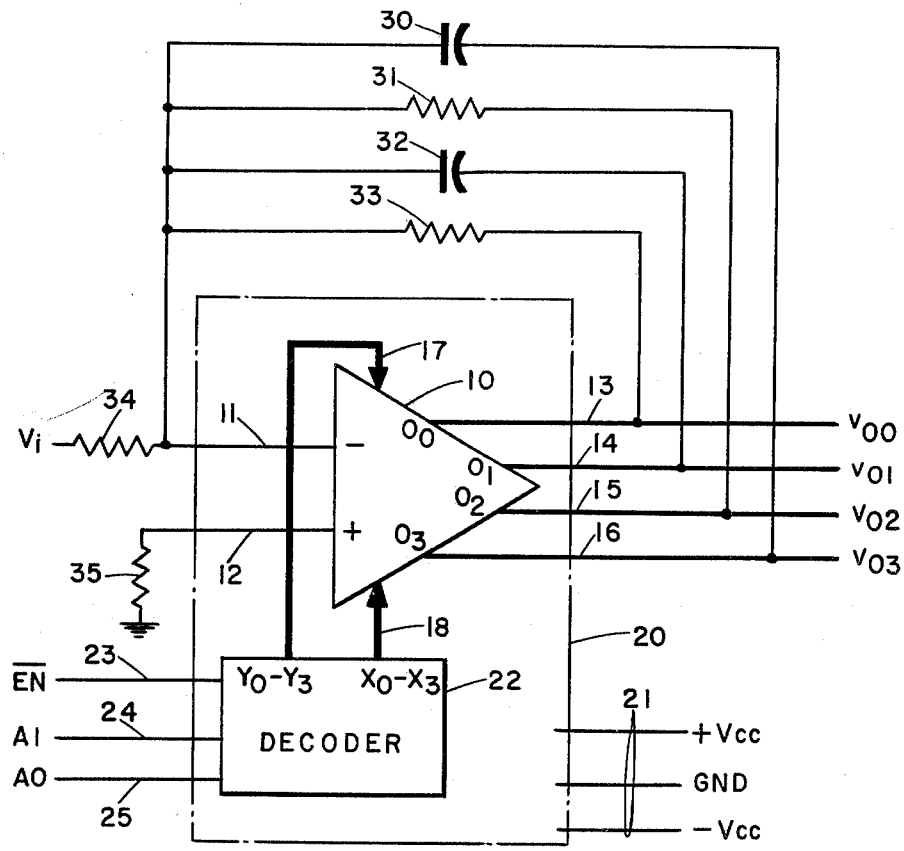
FIG. 1 is a block diagram of the disclosed differential amplifier having external feedback connected thereto.
FIG. 2 is a table illustrating how various outputs of the FIG. 1 amplifier are selected by encoded logic signals.

Referring now to FIG. 1, a block diagram of a multi-output differential amplifier 10 which is constructed according to the invention is illustrated. Amplifier 10 includes input terminals 11 and 12, and output terminals 13, 14, 15 and 16. In operation, amplifier 10 generates an analog signal representative of any voltage difference between input terminals 11 and 12, and selectively couples this analog signal to one of the output terminals 13–16. Also included within amplifier 10 are output control buses 17 or 18. Output selection signals Y0–Y3 and X0–X3 respectively are applied to buses 17 and 18 to select the output terminals that is to be activated.

Amplifier 10 is integrated on a semiconductor chip 20. Input leads 11–12 and output leads 13–16 connect to respective pins on chip 20. Other pins on chip 20 are provided to connect various voltages to amplifier 10 as indicated at 21. Also included in one preferred embodiment of the invention is a decoder circuit 22. This circuit is integrated on chip 20 and operates to reduce the number of pins that are needed for generating output selection signals on buses 17 and 18.

Decoder 22 has inputs 23, 24 and 25 for respectively receiving logic signals $\overline{EN}$, A1 and A0. The correlation between the logic state of these signals, the state of signals X0–X3, and Y0–Y3, and the active output of amplifier 10 is illustrated in FIG. 2. In that figure, L represents a relatively low voltage, H represents a relatively high voltage, OC represents an open circuit, and $\phi$ represents a don't care condition.

An important feature of the disclosed amplifier is that it can perform four independent functions on the signals that are applied to its input terminals. This is achieved by connecting four independent feedback circuits from outputs 13-16 to the input terminals 11 and 12, and by selecting a particular feedback circuit by the logic signals on leads 23-25. An example of this independent feedback is illustrated in FIG. 1 by components 30-33.

Components 30-33 together with resistors 34 and 35 and amplifier 10 form a four function operational amplifier. In the illustrated configurations, signals on leads 13 and 15 are the inverted and scaled integral of the signal $v_i$ applied to resistors 34; whereas signals on leads 14 and 16 are the inverted and scaled multiple of signal $v_i$. A variety of other functions can of course be achieved by amplifier 10 simply by changing the external feedback between leads 11-12 and 13-16. Some of these functions are described in the previously cited linear applications handbook by National Semiconductor Corporation, for example.

Figure 3:
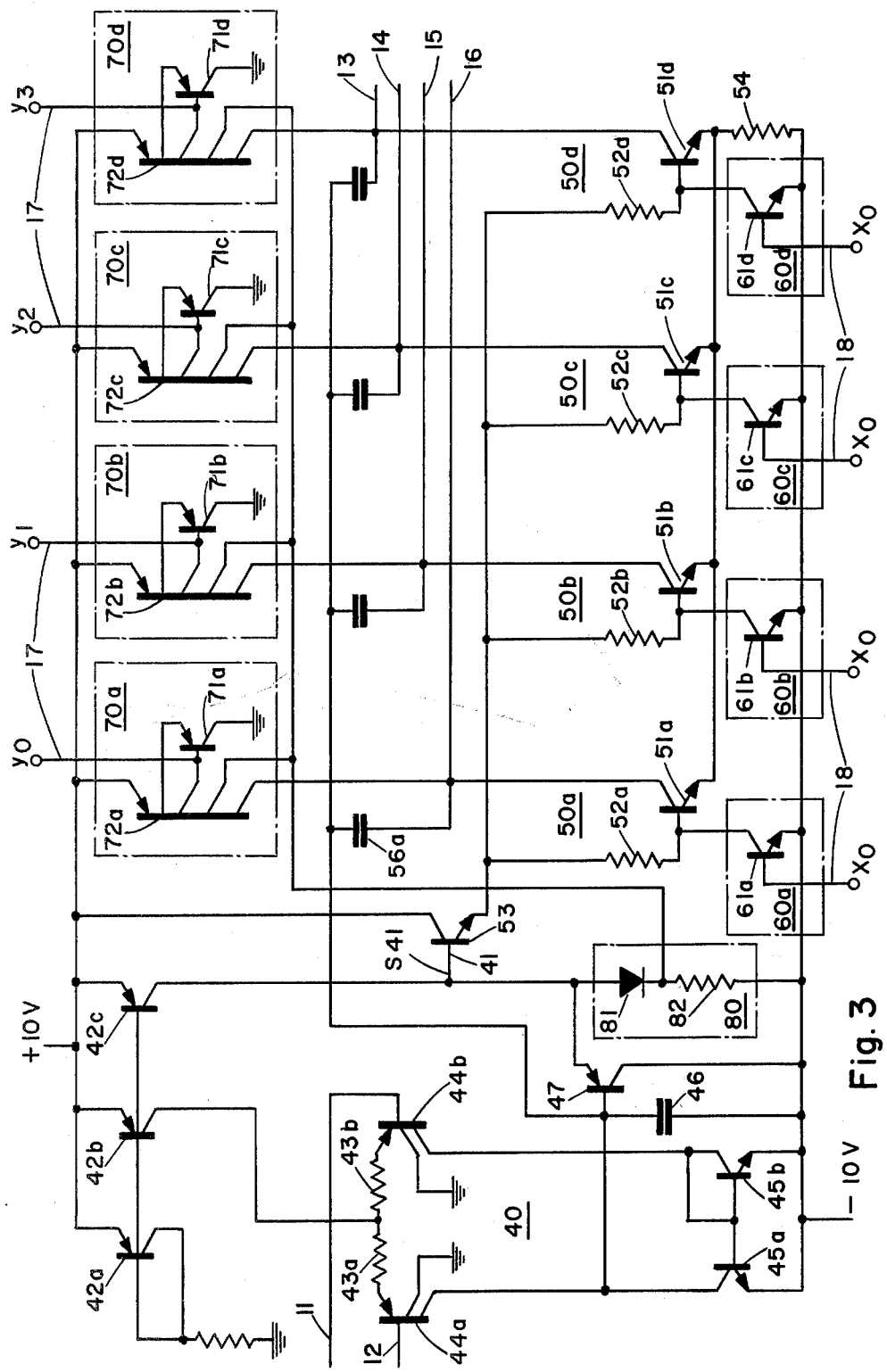
FIG. 3 is a detailed circuit diagram of a preferred embodiment of the differential amplifier of FIG. 1.

Referring now to FIG. 3, the details of a preferred circuit for amplifier 10 will be described. Basically, this preferred circuit includes a first transistor amplifier 40 and a plurality of second transistor amplifiers 50a-50d. Amplifier 40 connects to input terminals 11 and 12 and generates an analog signal S41 on a lead 41 which is representative of any voltage difference between the signals on lead 11 and 12. Signals S41 couples to the input of amplifiers 50a-50d. These amplifiers selectively couple signal S41 to the output leads 13-16 as illustrated in FIG. 3. Biasing circuits 60a-60d and 70a-70d are also included to accomplish this selective coupling. The detailed interaction of circuits 40, 50a-50d, 60a-60d, and 70a-70d is as follows.

Included within circuit 40 are three transistors 42a, 42b, and 42c. Each of these transistors supply at their respective collectors a constant current of approximately 20 microamps. In the quiescent state, the voltage on leads 11 and 12 is approximately equal, and the collector current from transistor 42b divides equally through resistors 43a, 43b and transistors 44a, 44b. That is, approximately 10 microamps passes into the emitter of transistor 44a and ten microamps passes into the emitter of transistor 44b.

Transistors 44a and 44b each have two collectors. Suitably, these collectors are equal in size; and thus the emitter current is approximately equally divided between them. Accordingly, under balanced conditions, the collectors of transistors 43a, and 43b each carry approximately five microamps.

In the non-balanced state, however, the voltage on the leads 11 and 12 differ slightly from each other. This difference may be in the microvolt range for example. When this occurs, the multi output differential amplifier operates to generate an output voltage on the active output terminal such that the voltage on leads 11 and 12 will be forced through the external feedback to equal each other. Consider for example, the operation of the circuit of FIG. 3 when the output terminal 13 is active, input 12 is clamped to ground, terminal 11 couples to terminal 13 through a feedback resistor R1, and an input signal $v_i$ is applied to terminal 11 through an input resistor R2. If signal $v_i$ is plus 1 volt and resistors R1 and R2 are equal, then amplifier 10 will generate minus 1 volt on lead 13 which in turn will force lead 11 to ground, (the voltage on lead 12).

Subsequently, if signal $v_i$ increases, the voltage on lead 11 will also instantaneously increase. Suppose for example, the voltage on lead 11 increases by one microvolt. This in effect will decrease the base to emitter voltage of transistor 44b. In response, transistor 44b will become less conductive. Thus, the current in the output collectors of transistor 44b will decrease. One of the collectors of transistor 44b connects to the base of transistors 45a and 45b. A decrease in this base current makes transistor 45a less conductive. In other words it increases the resistance at the collector of transistor 45a. Thus, the voltage at the collector of transistor 45a increases.

This voltage further increases due to an increase in the collector current of transistor 44a when the voltage on lead 11 increases. That is, an increase in voltage on lead 11 results in both a decrease in the collector current of transistor 44b and an increase in the collector current of transistor 44a. This is because transistor 42b supplies essentially a constant current. The combined effect of these two changes produces the total increase in voltage at the collector of transistor 45a.

A capacitor 46 and a transistor 47 connect to the collector of transistor 45a. Transistor 42c supplies current through the emitter of transistor 47; and the amount of current which transistor 47 passes is controlled by the collector voltage of transistor 45a. Specifically, transistor 47 becomes less conductive as the collector voltage of transistor 45a increases. Thus, an increase in voltage on lead 11 results in an increase in the resistance at the emitter of transistor 47, which in turn raises the voltage at that point. This emitter voltage was previously described as analog signal S41. Thus, signal S42 increases when the voltage on lead 11 is larger than the voltage on lead 12; and signal S41 decreases when the signal on lead 12 is larger than the signal on lead 11.

Signal S41 is selectively coupled to output terminals 13-16 through amplifiers 50a-50d. These amplifiers respectively include a transistor 51a-51d to the emitter of a buffer transistor 53. The base of transistor 53 is coupled to receive signal S41; and the collector of transistor 53 connects to a fixed voltage source. In operation, transistor 53 supplies current to resistors 52a-52d in proportion to the magnitude of signal S41. This current controls the conductance of transistors 51a-51d such that the output voltage developed at their respective collectors decreases as signal S41 increases; and vice versa. In this manner the output voltage on leads 13-16 is generated such that it, in combination with an external feedback network, will equalize the voltage on leads 11 and 12.

In the preferred embodiment, the circuits 60a-60d which provide a means for selectively connecting or disconnecting the base of transistors 51a-51d to a predetermined bias voltage each consist of a single transistor 61a-61d. Transistors 61a-61d respectively have a collector connected to the base of transistors 51a-51d, an emitter connected to a predetermined bias voltage, and a base for receiving output selection signals X0-X3. A high X0 signal turns on transistor 61. This connects the base of transistor 51a to a low voltage, such as −10 v, and turns it off. Conversely, a low X0 signal turns off transistor 61a, and allows base current to pass through resistor 52a and bias transistor 51a in an active state. Output selection signals X1, X2 and X3 operate to selectively bias transistors 51b, 51c, and 51d in a similar fashion.

Also preferably, the circuits 70a-70d which selectively connect and disconnect the collector of transistors 51a-51d to a bias source each consist of a pair of transistors 71a-71d, and 72a-72d. Each of these transistor pairs from a current mirror. In operation, signals Y0-Y3 are forced to a relatively low voltage state to actively bias the output amplifiers, and are forced into an open circuit condition to disable the output amplifiers. A low voltage state of signal Y0, for example, allows transistor 71a to conduct; and this in turn enables transistor 72a to conduct. More specifically, a current $I_o$ from the lead carrying signal Y0 generates a current of approximately ten times $I_o$ on the lead connected to the collector of transistor 51a. This current develops the voltage across transistor 51a which in turn forms the output signal on output terminal 16. The current mirrors formed by transistor pairs 71b and 72b, 71c and 72c, 71d and 72d also operate in a similar fashion.

Also included in the disclosed multi output differential amplifier is a circuit for clamping signal S41 to a predetermined bias voltage whenever all of the output amplifiers 50a–50d are biased to an inactive state. This clamping circuit includes a diode 81 and a resistor 82. Under the condition where none of the output amplifiers 50a–50d are active, the voltage across resistor 82 is determined solely by the current supplied by transistor 42c. This current and resistor 82 are chosen such that diode 81 is forward biased. Suitably, transistor 42c may supply approximately 20 microamps; and resistor 82 may be approximately 24 K ohms. This places the voltage across resistor 82 to approximately only 0.48 volts when none of the output amplifiers 50a–50d are active. Due to this small voltage, diode 81 becomes forward biased. Thus, signal S41 is clamped to 0.48 volts plus the forward voltage drop of diode 81, or approximately 1.1 volts.

Conversely, when one of the output stages 50a–50d is active, a current of approximately $I_o$ is supplied to resistor 82 by a collector in one of the current mirrors 70a–70d. This current raises the voltage across resistor 82, which in turn reverse biases diode 81. Suitably, this current is approximately 150 microamps. This increases the voltage drop across the 24 K ohm resistor 82 by approximately 3.6 volts. As a result, diode 81 becomes reverse biased. This in turn allows signal S41 to swing in response to any voltage difference across leads 11 and 12 as was previously described.

Circuit 80 is particularly useful when one of the outputs of the disclosed multi output amplifier is used in an audio system to drive a speaker. (Other outputs may also be used in such a system to drive a playback speaker, and/or to drive a recording head, for example.) In such a system, circuit 80 operates to remove transients on signal S41 during the time intervals that the system is being switched from a record to a playback mode, or vice versa. These transients, if not removed, result in audible "cracks" or "pops" at the speaker output. The disclosed amplifier automatically removes these transients by clamping signal S41 whenever the output selection signals Y0–Y3 indicate that none of the outputs 13–16 are active; i.e., that the active outputs are being switched.

Next, referring to FIGS. 4 and 5, one preferred circuit for generating the output selection signals Y0–Y3 and X0–X3 will be described. Basically, the circuit of FIG. 4 receives three logic signals A0, A1 and $\overline{EN}$; and converts these signals to the output selection signals X0–X3 and Y0–Y3. To this end, signals A0–A1 are respectively coupled via leads 90 and 91 and to inverters 92 and 93. The output from inverters 92 and 93 are logically ANDED by an AND gate 94a to form signal X0. Similarly, signals X1, X2 and X3 are respectively formed by logical AND gates 94b, 94c, and 94d. Signals X0, X1, X2 and X3, respectively represent a decode of a binary 0, 1, 2 and 3 of signals A0 and A1.

Figure 4:
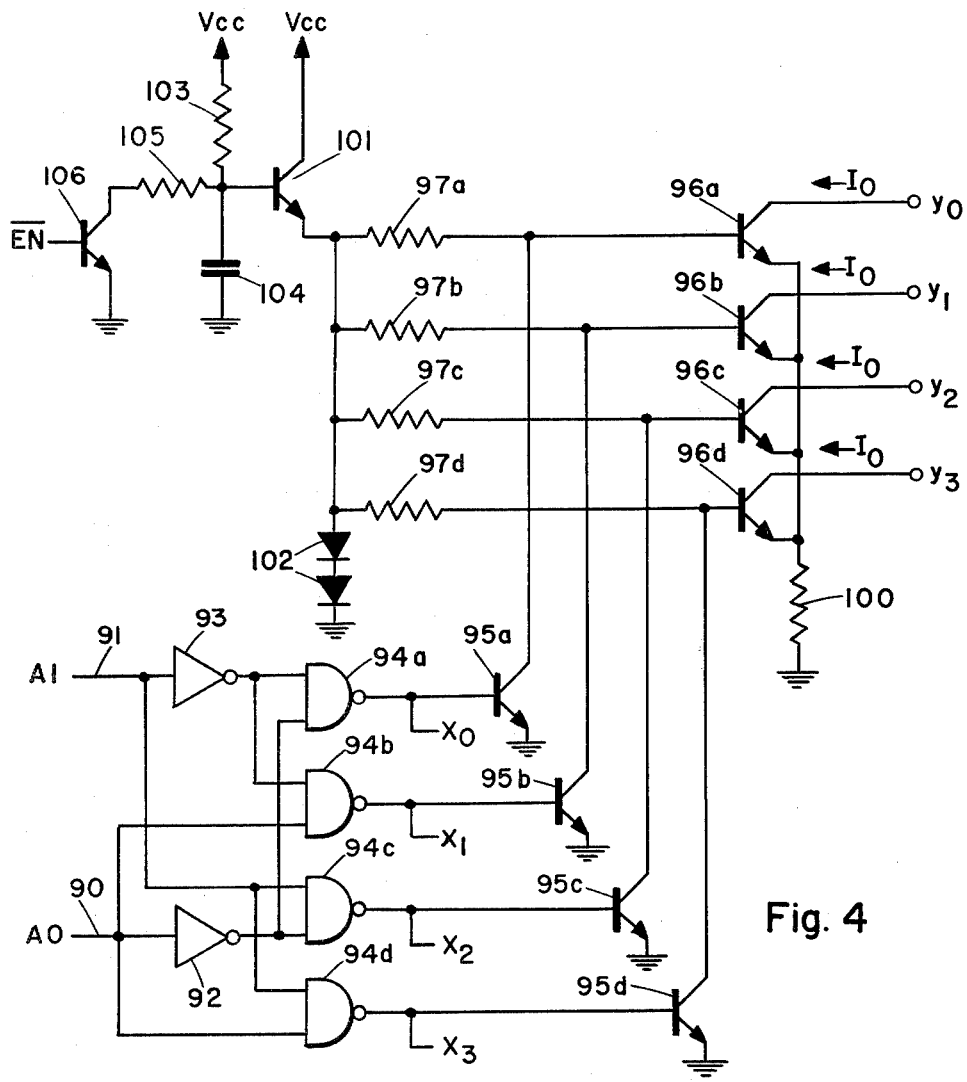
FIG. 4 is a detailed circuit diagram of a preferred embodiment of the decoder of FIG. 1.

Signals X0–X3, together with signal $\overline{EN}$, are combined by the remaining portion of the FIG. 4 circuit to form signals Y0–Y3. Specifically, signals Y0–Y3 respectively are formed at the collector of transistors 96a–96d. A resistor 100 connects the emitters of transistors 96a–96d to ground. Base current for transistors 96a–96d is supplied by a voltage source $V_{cc}$, a transistor 101, diodes 102 and resistors 97a–97d.

Transistor 101 is enabled to supply base current when signal $\overline{EN}$ is low. This low voltage turns off a transistor 106, which in turn allows transistor 101 to turn on and supply base current to the transistors 96a–96d. The particular one of the transistors 96a–96d that receives base current is determined by the state of signals X0–X3. For example, a high voltage level of signal X0 turns on a transistor 95a, which in turn sinks base current away from transistor 96a and turns it off. Conversely, a low voltage state of signal X0 turns off transistor 95a, which allows transistor 96a to turn on and activate current source 70a. Signals X1, X2 and X3 respectively operate in conjunction with transistors 95b, 95c, and 95d in a similar fashion.

Figure 5:
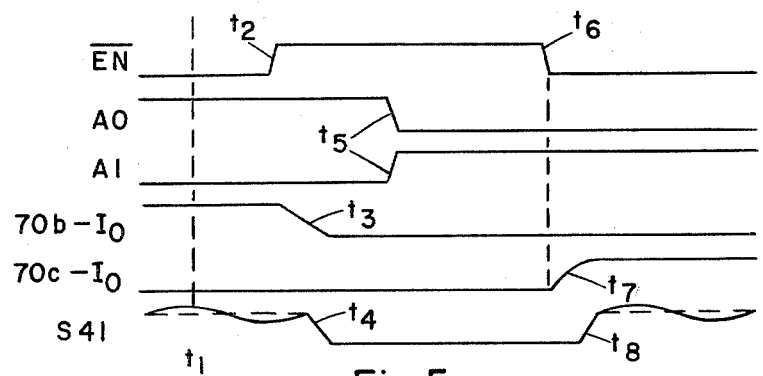
FIG. 5 is a detailed timing diagram illustrating the operation of the decoder of FIG. 4.

A timing diagram illustrating a sequence for selecting and deselecting a particular output of the disclosed multi output differential amplifier is illustrated in FIG. 5. A time t1, signal $\overline{EN}$ is low and signals A0 and A1 select which of the outputs of the multi output amplifier are active. In the illustrated example, signal A0 is high and signal A1 is low; and thus output 14 is active. This is indicated by the presence of current $I_o$ from current mirror 70b.

Subsequently, at time instant t2, signal $\overline{EN}$ goes high. In response thereto, the current $I_o$ from current mirror 70b slowly decays to zero. This decay time is determined by the time constant of component 104 and 105. As the current $I_o$ decays, the voltage across clamping circuit 80 decreases. This in turn forward biases diode 81 as described above. As a result, signal S41 is clamped to approximately 0.4 volts. This is illustrated at time instant t4.

Subsequently, signals A0 and A1 are changed by an external source to select a new output. In the Illustrated example, output amplifier 2 is selected at time instant t5. After the new output is selected, signal $\overline{EN}$ is forced low to allow the newly selected output to be activated. This is illustrated at time instant t6. In response to signal $\overline{EN}$ going low, current $I_o$ from mirror 70c ramps up at a rate determined by the time constant of components 104 and 105. This is illustrated at time instant t7.

As current $I_o$ ramps up, so does the voltage across resistor 82 in clamping circuit 80. As a result, diode 81 becomes reversed biased, which allows signal S41 to swing in response to the signals on the differential input leads 11 and 12. This is illustrated in time instant t8.

Various preferred specific embodiments of the invention have now been described in detail. In addition, many changes and modifications can be made to these embodiments without departing from the nature and spirit of the invention. For example, the number of output stages may be either increased or decreased.

An amplifier having two output stages could be implemented, for example, by eliminating those components associated with output circuits 50c and 50d; and by eliminating those components in the output selection circuit of FIG. 4 which generate signals X2, X3, Y2, and Y3.

As another variation on the disclosed embodiment, various types of circuits may be substituted for circuits 60a–60d, or 70a–70d which selectively bias the output amplifiers to either an active or inactive state in response to the output selection signals. Therefore, since many changes and modifications can be made to the disclosed embodiment without departing from the nature and spirit of the invention, it is to be understood that the invention is not limited to said details, but is defined by the appended claims.

Having described my invention, I now claim:

1. A multi-output differential amplifier integrated on a semiconductor substrate comprising;
   input terminal means for simultaneously receiving a pair of analog voltages;
   first transistor means connected to said input terminal means for generating an analog signal representative of any voltage difference between said pair;
   a plurality of output terminal means;
   a plurality of output transistors, each of said transistors having a base coupled to receive said analog signal and having a collector coupled to a respective one of said output terminal means;
   a plurality of selectively activated current source means coupled respectively to the collectors of said output transistors for supplying current to selectable ones of said collectors in response to output selection signals; and
   a plurality selectively activated current sinking means coupled respectively to the bases of said output transistors for sinking current from selectable ones of said bases in response to said output selection signals.

2. A multi output differential amplifier according to claim 1 and further including a voltage clamping circuit coupled between said current sources and said first transistor means for clamping said analog signal to a predetermined level whenever said selectively activated current sources are all de-activated.

3. A multi output differential amplifier according to claim 1 and further including a logic circuit for receiving encoded logic signals designating which of said current sources and said currents sinks to selectively activate and for generating said output selection signals in response thereto.

4. A multi output differential amplifier according to claim 1 wherein said plurality of output transistors consists of a total of four transistors.

5. A multi output differential amplifier according to claim 4 wherein each of said four transistors are NPN type.

6. A multi output differential amplifier according to claim 1 wherein each of said current source means consists of a two transistor current mirror.

7. A multi output differential amplifier according to claim 1 wherein each of said current sink means consists of a single transistor having a collector connected to the base of an output transistor, a base for receiving said output selection signals, and an emitter connected to a bias voltage.

8. A multi output differential amplifier integrated on a semiconductor substrate comprising;
   input terminal means for simultaneously receiving a pair of analog voltages through externally supplied input impedances,
   first transistor means connected to said input terminal means for generating an analog signal representative of any voltage difference between said pair;
   a plurality of output terminal means for connection via respective externally supplied feedback impedances to said input terminal means;
   a plurality of output amplifiers each of said amplifiers having an input coupled to receive said analog signal and having an output coupled to a respective one of said output terminal means;
   a plurality of selectively activated current source means coupled respectively to said output amplifiers for supplying current to selectable ones of said amplifiers in response to output selection signals; and
   a plurality of selectively activated current sinking means coupled respectively to said output amplifiers for sinking current from selectable ones of said amplifiers in response to said output selection signals.

9. A multi output differential amplifier according to claim 8 wherein each of said output amplifiers includes a transistor having a base coupled to a respective one of said current sinking means, and having a collector coupled to a respective one of said current source means.

* * * * *